United States Patent
Wu et al.

[11] Patent Number: 6,075,400
[45] Date of Patent: Jun. 13, 2000

[54] CANCELLATION OF INJECTED CHARGE IN A BUS SWITCH

[75] Inventors: Ke Wu, Fremont; Arnold Chow, Sunnyvale, both of Calif.

[73] Assignee: Pericom Semiconductor Corp., San Jose, Calif.

[21] Appl. No.: 09/133,743

[22] Filed: Aug. 13, 1998

[51] Int. Cl.[7] ................................................. H03K 17/30
[52] U.S. Cl. ............................................ 327/382; 327/404
[58] Field of Search .................................. 327/382, 403, 327/404, 425, 426, 427

[56] References Cited

U.S. PATENT DOCUMENTS

| | | | |
|---|---|---|---|
| 4,473,761 | 9/1984 | Peterson | 307/579 |
| 4,511,814 | 4/1985 | Matsuo et al. | 307/572 |
| 4,559,548 | 12/1985 | Iizuka et al. | 357/23.6 |
| 4,599,522 | 7/1986 | Matsuo et al. | 307/576 |
| 4,611,135 | 9/1986 | Nakayama et al. | 307/572 |
| 4,651,037 | 3/1987 | Ogasawara et al. | 307/572 |
| 4,988,902 | 1/1991 | Dingwall | 307/572 |
| 5,111,072 | 5/1992 | Seidel | 307/353 |
| 5,130,571 | 7/1992 | Carroll | 307/352 |
| 5,180,930 | 1/1993 | Mayes | 307/353 |
| 5,430,408 | 7/1995 | Ovens et al. | 327/404 |
| 5,436,584 | 7/1995 | Bodas et al. | 327/310 |
| 5,534,815 | 7/1996 | Badyal | 327/437 |
| 5,550,503 | 8/1996 | Garrity et al. | 327/437 |
| 5,644,257 | 7/1997 | Kerth et al. | 327/96 |
| 5,650,744 | 7/1997 | Oh | 327/362 |

*Primary Examiner*—Jeffrey Zweizig
*Attorney, Agent, or Firm*—Stuart T. Auvinen

[57] ABSTRACT

A bus switch has control of the timing of turning on and off the main p-channel and n-channel transistors that connect two network nodes. A pair of cross-coupled NAND gates form a set-reset S-R latch that controls the gates of the main p-channel and n-channel transistors. The S-R latch controls the timing so that the main p-channel and n-channel transistors switch at about the same time, canceling much of each other's injected charge. Since the main p-channel is larger due to the lower hole mobility, an excess of injected charge from the p-channel transistor remains. This excess charge is cancelled by opposite charge injected by compensating transistors. The compensating transistors are also p-channel devices, but are driven with a logical inverse of the gate of the main p-channel transistor. This produces a charge with opposite polarity to the excess charge from the main p-channel transistor. The sources and drains of the compensating transistors are connected together so that they transistors act as capacitors. A connecting p-channel transistor is added in parallel with the main p-channel transistor. The connecting p-channel transistors is turned on early, before the main p-channel transistor, to increase the capacitance by connecting the two network nodes. The increased capacitance decreases the voltage spike caused by a fixed amount of injected charge.

17 Claims, 4 Drawing Sheets

CANCELLATION OF INJECTED CHARGE IN A BUS SWITCH

FIELD OF THE INVENTION

This invention relates to semiconductor bus-switches, and more particularly for noise reduction in a bus switch.

BACKGROUND OF THE INVENTION

High-speed communication systems are used to connect computer users together. Networks allow users to share data and work cooperatively. At a physical level, these networks have cables that connect together user's stations, and these cables are in turn connected together using relays or switches. Traditional electro-mechanical relays are being replaced by solid-state relays and bus switches.

Bus switches are semiconductor integrated circuits (IC's) that use metal-oxide semiconductor (MOS) transistors to make or break the connection. Several switches may be combined on a single silicon die. One such device is made by the assignee and marketed as the PI5C3861 Bus Switch. More background on bus switches can be found in "Parallel Micro-Relay Bus Switch for Computer Network Communication with Reduced Crosstalk and Low On-Resistance using Charge Pumps", assigned to Pericom Semiconductor and Hewlett-Packard Company, U.S. Pat. No. 5,808,502, U.S. Ser. No. 08/622,703. Also see "Bus Switch Having Both P- and N-Channel Transistors for Constant Impedance Using Isolation Circuit for Live-Insertion when Powered Down", U.S. Pat. No. 6,034,553, U.S. Ser. No. 09/004,929, assigned to Pericom Semiconductor.

FIG. 1 shows a prior-art bus switch device. A p-channel transistor is connected in parallel to the n-channel transistor to form a complementary metal-oxide-semiconductor (CMOS) bus switch. FIG. 1 shows p-channel transistor 12 connected in parallel with n-channel transistor 10 to form a CMOS bus switch. An enable signal is applied to the gate of n-channel transistor 10. An inverter generates the inverse of the enable signal, which is applied to the gate of p-channel transistor 12. Thus both transistors 10, 12 are enabled or disabled at the same time.

A CMOS bus switch does not develop a voltage drop across the source and drain terminals, even when reduced power supplies are used. For high signals when n-channel transistor 10 becomes saturated, p-channel transistor 12 is still in the linear region of operation and thus passes a full 3-volt signal across its channel without the threshold-voltage drop experienced by a single n-channel transistor.

As networks improve, nodes may have lower capacitance and are thus more susceptible to noise injection. For example, the output node OUT of FIG. 1 may be an isolated node with low capacitance or tight noise margins that is sensitive to noise when isolated by the bus switch.

Noise may be injected into the OUT node by the bus switch itself. As the bus switch is turning off, the gate of n-channel transistor 10 is driven from high to low. A parasitic capacitance from the gate to the source or drain of n-channel transistor 10 couples charge Q to node OUT. A fractional portion of the voltage swing on the gate I capacitivly coupled to the source/drain node OUT. Especially when node OUT has a low capacitance, the voltage swing coupled across n-channel transistor 10 may be sufficient to cause network problems. Charge coupling can also occur when the transistor channel is turning on, from the gate to the main channel.

Even relatively small voltage swings coupled through transistor 10 can upset high-speed analog communication signals that may be transmitted over node OUT. Transmission could be occurring between two other endpoints on node OUT while the bus switch is isolating the common node COM. This transmission could be disturbed by the closing of the bus switch.

Transmission could be stopped while the bus switch is turned on or off, but this is undesirable. It is better if the network can remain in operation while bus switches dynamically isolate and reconnect segments.

FIG. 2 is a graph showing voltage spikes caused by charge injection as a bus switch isolates and reconnects a network segment. As the input signal VIN 14 to the n-channel gate rises in voltage, negative charge is injected into node OUT by gate-source coupling from transistor 12. This injection causes a negative voltage spike on Vout 16. Eventually, as the bus switch turns on, the n-channel and p-channel transistors start to conduct, allowing the voltage spike to be dissipated.

As the bus switch is turned off, VIN 14 falls in voltage. A positive voltage spike is coupled into Vout 16 from the gate of transistor 12. Since the node OUT is now isolated, the voltage spike can have a longer duration before dissipating.

Voltage spikes can occur on both turn off and turn on of the bus switch. The p-channel transistor can also contribute to charge injection, although the p-channel transistor tends to cancel the charge injected by the n-channel transistor, since the voltage swing on the p-channel transistor is always opposite to the swing on the n-channel transistor. However, the p-channel and n-channel transistors are often of different sizes, having different gate-source capacitances. Also, the timing of the n-channel and p-channel voltage swings may not be matched, causing one transistor or the other to dominate charge injection.

What is desired is a bus switch with low noise injection. It is desired to minimize noise injected by a bus switch as the bus switch is turned on and off. It is desired to cancel injected charge to minimize voltage spikes. More precise timing of bus-switch transistors is desirable.

SUMMARY OF THE INVENTION

A charge-canceling bus switch has a first input, a second input, and a control input for indicating when the bus switch connects or isolates the first input to the second input. A p-channel main transistor has a conducting channel that selectively couples the first input to the second input in response to the control input. The p-channel main transistor injects a first charge into the first input in response to a transition of the control input.

An n-channel main transistor has a conducting channel that selectively couples the first input to the second input in response to the control input. The n-channel main transistor injects a second charge into the first input in response to a transition of the control input.

A first compensating capacitor is coupled to the first input. It injects a compensating charge into the first input in response to a transition of the control input. Thus the compensating charge compensates for a difference between the first charge and the second charge to reduce a net charge injected into the first input when the transition of the control input occurs.

In further aspects of the invention the first charge has an opposite polarity to the second charge, and a magnitude of the first charge does not match a magnitude of the second charge. A second compensating capacitor is coupled to the second input. It injects a second compensating charge into the second input in response to a transition of the control input. Thus both the first input and the second input are charge-compensated.

In still further aspects the first compensating capacitor is a complementary metal-oxide-semiconductor (CMOS) transistor having a source and a drain connected to the first input. The second compensating capacitor is also a CMOS transistor having a source and a drain connected to the second input.

In other aspects the first gate of the first compensating capacitor is connected to the second gate of the second compensating capacitor. The first compensating capacitor is a p-channel transistor, and the second compensating capacitor is a p-channel transistor.

In still further aspects a connecting transistor is coupled between the first input and the second input. It connects the first input to the second input before the p-channel main transistor connects the first input to the second input during the transition when the transition of the control input connects the first input to the second input. The connecting transistor is a p-channel transistor with a source connected to the first input and a drain connected to the second input.

In further aspects the p-channel main transistor is at least ten times larger than the connecting transistor. The p-channel main transistor is also at least ten times larger than the first compensating capacitor.

BRIEF DESCRIPTION OF THE DRAWINGS

FIG. 4 shows the timing of internal signals when the bus switch is turned on.

DETAILED DESCRIPTION

The present invention relates to an improvement in bus switches. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Charge injection can be minimized by reducing the rise and fall times of the input signals applied to the gates of bus-switch transistors. However, this can reduce performance since the bus switch is turned on and off more slowly.

The inventors have realized that voltage spiking caused by charge injection can be minimized by canceling charges. A charge with an equal magnitude but opposite polarity can be injected to cancel charge injection from parasitic capacitances.

Figure 3:
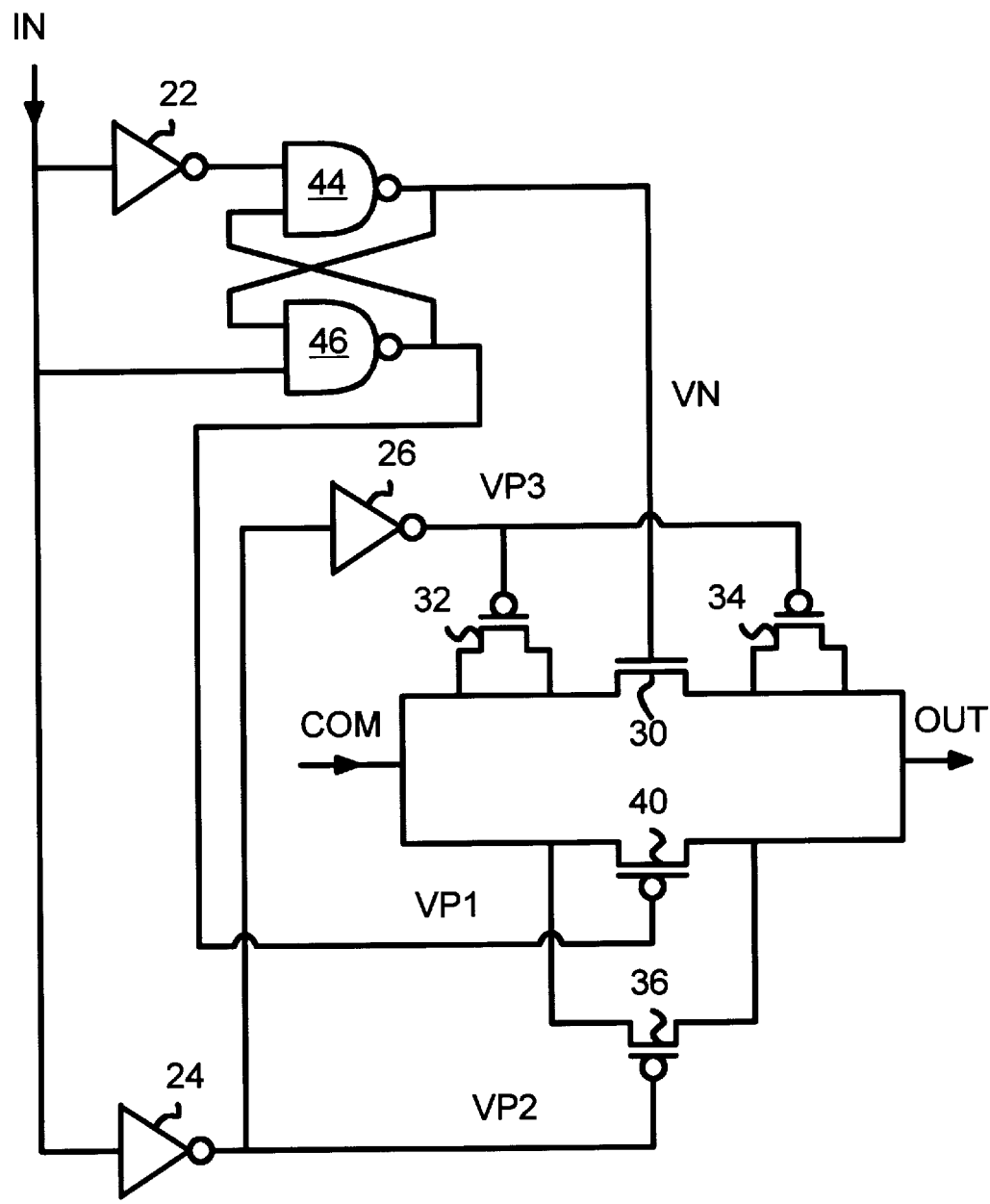
FIG. 3 is a schematic of a bus switch that generates a canceling charge to minimize noise injection.

FIG. 3 is a schematic of a bus switch that generates a canceling charge to minimize noise injection. The bus switch selectively connects a common network node COM with an output node OUT. Both OUT and COM can be different segments of a network, or COM can be connected to a constant voltage, preferably within the power-supply rails. When input signal IN is high, n-channel main transistor 30 and p-channel main transistor 40 are both on, causing the bus switch to connect network nodes COM and OUT. When input signal IN is low, main transistors 30, 40 are both off, isolating COM and OUT.

Main transistors 30, 40 are much larger than p-channel compensating transistors 32, 34, and p-channel connecting transistor 36, typically by a factor of ten or more. Thus most charge is injected by main transistors 30, 40. Compensating transistors 32, 34 are used to compensate for injection by p-channel main transistor 40. Compensating transistors 32, 34 have their sources and drains connected together and act as capacitors. Their capacitance increases as the gate voltage falls and a conducting channel is formed under their gates.

The gates of p-channel compensating transistors 32, 34 are driven with a logical inverse of the signal applied to the gate of p-channel main transistor 40. Thus when positive charge is injected into node OUT by main transistor 40, a negative charge is injected by compensating transistors 32, 34 to cancel the injected charge. Likewise, as the gate voltage VP1 rises, injecting a negative charge, gate voltage VP3 falls, injecting a positive charge to compensate.

Connecting transistor 36 is turned on earlier than main transistors 30, 40, and turned off later than main transistors 30, 40. Connecting transistor 36 couples nodes COM and OUT, increasing the source/drain capacitance and thus reducing voltage spikes caused by coupling of a fixed charge from main transistors 30, 40. Connecting nodes COM and OUT before the bus switch is tuned on, and while the bus switch is being turned off, helps to dissipate injected charge using both nodes OUT and COM, rather than just one of the nodes.

Main transistors 30, 40 are turned on and off at the same time, allowing them to cancel as much of each other's injected charge as possible. NAND gates 44, 46 form a cross-coupled set-reset latch that skews the timing of the gate signals applied to main transistors 30, 40. For example, when the bus switch is turned on by VIN rising, inverter 22 drives a low to NAND gate 44, which immediately drives high signal VN to the gate of n-channel main transistor 30. Then as the output of NAND gate 46 goes high, and VIN is already high, NAND gate 46 drives a low to signal VP1, applied to the gate of p-channel main transistor 40. Thus the n-channel main transistor 30 turns on slightly before p-channel main transistor 40, because VP1 turns low only when VN is already high.

When the bus switch is turned off by VIN falling, the output of NAND gate 46 goes low immediately, which drives a high to signal VP1, applied to the gate of p-channel main transistor 40. Inverter 22 drives a high to NAND gate 44, which must wait for the output of NAND gate 46 to go high before driving low signal VN to the gate of n-channel main transistor 30. Thus the n-channel main transistor 30 turns off slightly after p-channel main transistor 40, because VN turns low only when VP1 is already high. The sizes of transistors within NAND gates 44, 46 and inverter 22 are adjusted to match the turn on and off of main transistors 30, 40 as closely as possible. This close matching using NAND gates 44, 46 allows as much charge as possible to be cancelled by main transistors 30, 40. Using simple inverters rather than NAND gates 44, 46 would not allow the precise matching of timing.

Connecting transistor 36 is not delayed by NAND gates 44, 46, and thus turns on more quickly. This quick turn-on helps to dissipate injected charge when main transistors 30, 40 turn on. The delay through inverter 24 at turn-on is less than the delay through inverter 22 and NAND gates 44, 46, so that connecting transistor 36 turns on significantly before p-channel main transistor 40. For turn off, connecting transistor 36 turns off slightly after p-channel main transistor 40.

Compensating transistors 32, 34 are driven by inverter 26. The delay from VIN through inverters 24, 26 is set up such that VP3 is slower than VN and VP2 follows VP1.

Main transistors 30, 40 are much larger than p-channel compensating transistors 32, 34, and p-channel connecting transistor 36, typically being larger than p-channel main transistor 40 by a factor of ten or more. Since the mobility of electrons is almost double the mobility of holes, n-channel main transistor 30 is about half the size of p-channel main transistor 40. For low on-resistance, main transistors 30, 40 are each hundreds of microns in width.

Figure 4:
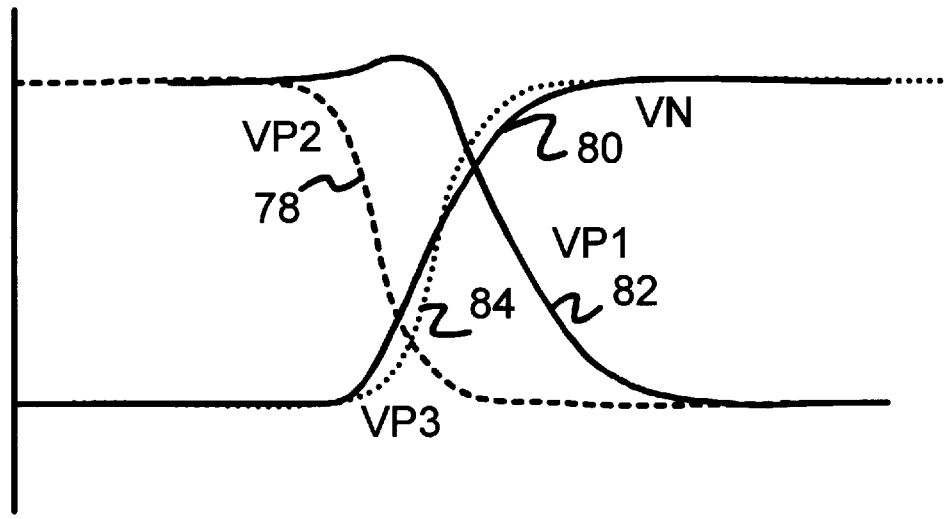
Figure 5:
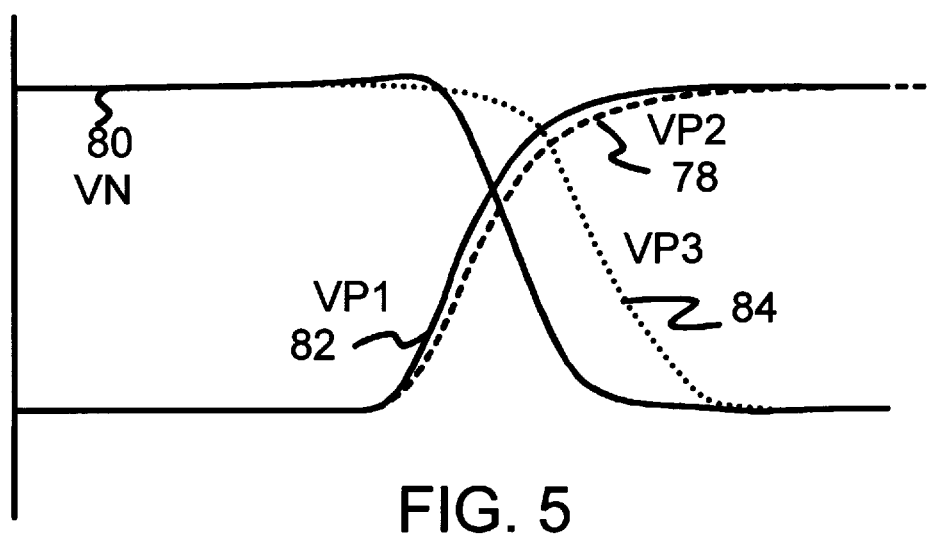
FIG. 5 shows the timing of internal signals when the bus switch is turned off.

Timing—FIGS. 4, 5

FIG. 4 shows the timing of internal signals when the bus switch is turned on. As input signal VIN rises (not shown), inverter 24 (FIG. 3) drives VP2 78 low. P-channel connecting transistor 36 is the first to turn on, connecting COM and OUT. Since connecting transistor 36 is relatively small, the amount of charge injected is minimal.

Inverter 22 and NAND gate 44 then drive signal VN 80 high, the gate of n-channel main transistor 30. Negative charge is coupled from the gate of main transistor 30 to node OUT. After the delay through NAND gate 46, signal VP1 82 is driven low, enabling p-channel main transistor 40. As signal VP1 82 falls, positive charge is coupled to node OUT. While some of this positive charge cancels the negative charge from n-channel main transistor 30, the larger size of p-channel main transistor 40 produces more positive charge than negative charge from n-channel main transistor 30.

Compensating transistors 32, 34 are driven by inverter 26 with rising signal VP3 84, which is delayed from signal VP2 78. As the gates of compensating transistors 32, 34 swing, a negative charge is injected, which cancels the excess positive charge from p-channel main transistor 40. The capacitance from compensating transistors 32, 34 is initially high, since the inputs signal VP3 is low, which exceeds the p-channel transistor threshold. Thus compensating transistors 32, 34 are initially on, and the conductive channel under their gates increases the capacitance. The higher initial capacitance increases the injected charge from compensating transistors 32, 34. Thus smaller-sized transistors can be used.

FIG. 5 shows the timing of internal signals when the bus switch is turned off. As input signal VIN falls (not shown), inverter 24 (FIG. 3) drives VP2 78 high while NAND gate 46 drives VP1 82 high. The sizes of inverter 24 and NAND gate 46 are such that VP2 78 is slightly slower than VP1 82. Transistors 36, 40 do not turn off at the same time, reducing spikes. P-channel main transistor 40 turns off first, followed by connecting transistor 36, dis-connecting COM and OUT.

After the delay through NAND gate 46, inverter 22 and NAND gate 44 drive signal VN 80 low, the gate of n-channel main transistor 30. Positive charge is coupled from the gate of main transistor 30 to node OUT. As signal VP1 82 rises, negative charge is coupled to node OUT. While some of this negative charge cancels the positive charge from n-channel main transistor 30, the larger size of p-channel main transistor 40 produces more negative charge than positive charge from n-channel main transistor 30.

Canceling transistors 32, 34 are driven by signal VP3 84, which rises, coupling a compensating negative charge into nodes COM and OUT. Two compensating transistors are provided since node OUT is isolated from node COM by transistors 30, 4, 36 being turned off.

Figure 6:
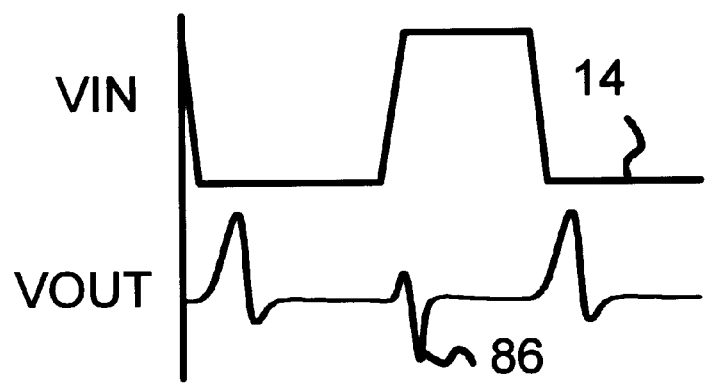
FIG. 6 is a graph of reduced voltage spikes using a bus switch with charge cancellation.

Reduced Voltage Spikes—FIG. 6

Figure 1:
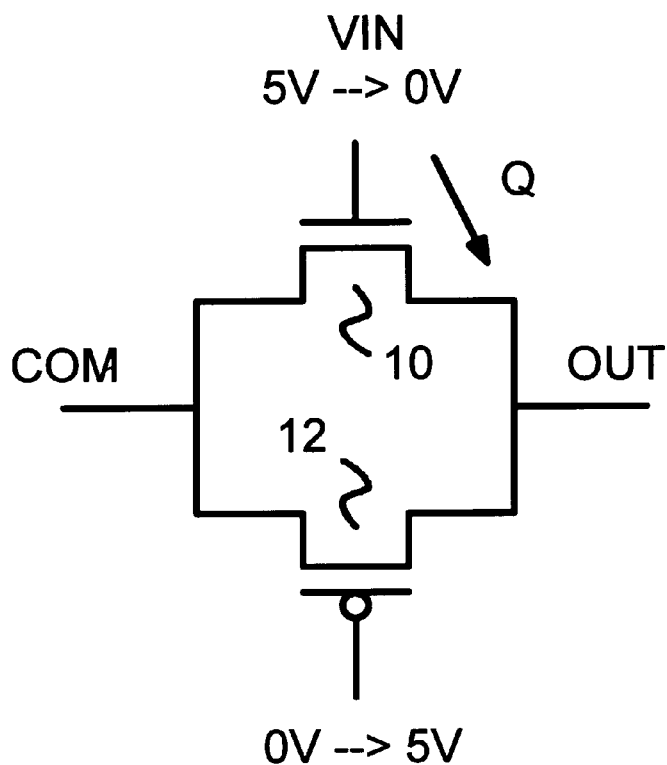
FIG. 1 shows a prior-art bus switch device.
Figure 2:
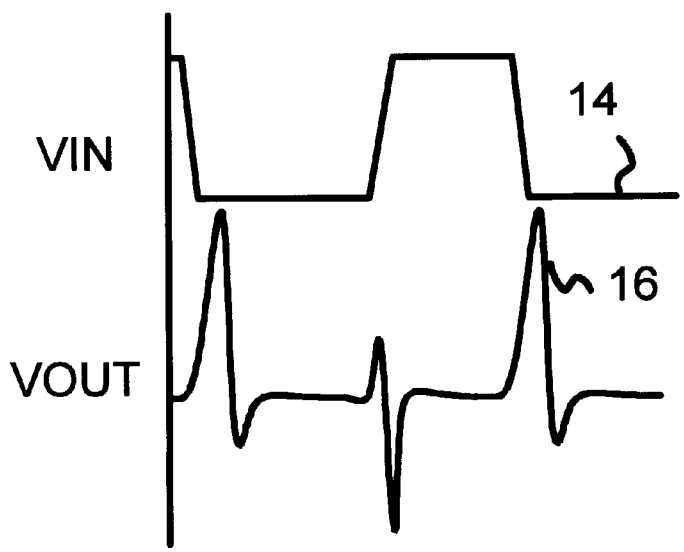
FIG. 2 is a graph showing voltage spikes caused by charge injection as a bus switch isolates and reconnects a network segment.

FIG. 6 is a graph of reduced voltage spikes using a bus switch with charge cancellation. When input signal VIN 14 rises, the bus switch closes, connecting two network nodes. Some charge is injected, although less than the prior art of FIG. 2. When input signal VIN falls, opening the bus switch, positive charge is injected, but again a smaller magnitude of net charge is injected, resulting in a smaller voltage spike on output voltage Vout 86.

Figure 7:
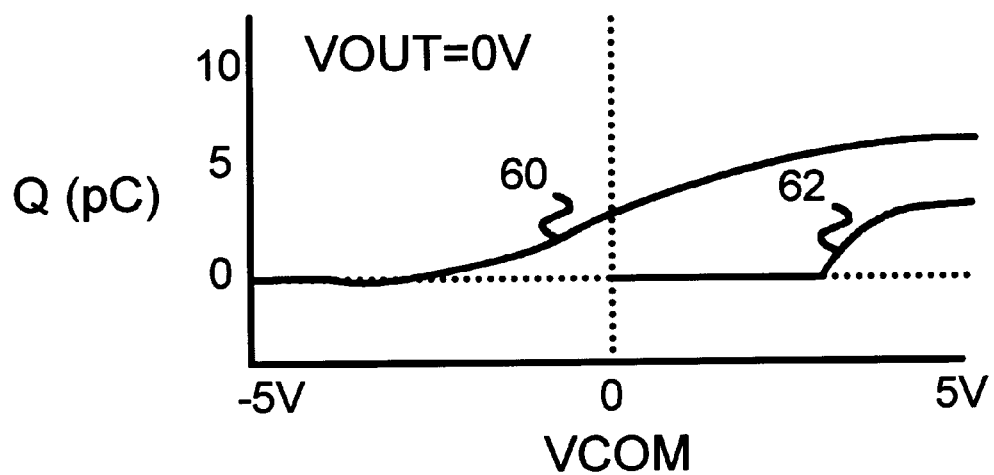
FIG. 7 graphically shows how the charge injected varies with the COM node voltage.

FIG. 7 graphically shows how the charge injected varies with the COM node voltage. When the isolated node OUT is held at ground (zero volts), the injected charge in pico-Coulombs (pC) varies with the voltage of the other node COM.

For a 5-volt power supply, curve 62 shows that the injected charge increases above about 3 volts for Vcom. Lower values of Vcom do not have any significant positive injected charge because of the better compensation between transistor sizes.

When a 10-volt supply is used, curve 60 shows the higher injected charge. The higher voltage swings on the gates of the bus-switch transistors increases the charge injected. Maximum injected charge is about 5 pC, compared with 10 to 13 pC for prior-art bus switches. Thus injected charge is reduced by more than half using the charge-canceling bus switch. Noise should also be reduced by a substantial amount.

ADVANTAGES OF THE INVENTION

A bus switch is shown with low noise injection. Noise injected by a bus switch is minimized as the bus switch is turned on and off. Injected charge is canceled to minimize voltage spikes. More precise timing of bus-switch transistors is achieved using cross-coupled NAND gates in a latch.

Using p-channel transistors for charge compensation is preferable over n-channel transistors, because the transistors are initially on rather than off. The higher channel capacitance of the on transistors increases capacitance. The higher initial capacitance increases the injected charge from the compensating transistors. Thus smaller-sized transistors can be used.

ALTERNATE EMBODIMENTS

Several other embodiments are contemplated by the inventors. For example, other transistor and gate arrangements can be substituted. Sizes of transistors can vary. The exact timing of signals can be modified. NOR gates rather than NAND gates can be used for the S-R latch. Non-inverting gates such as AND gates may also be used.

Sizes of transistors is generally described as width in microns divided by length in microns of the polysilicon gate. However, this size is an approximation of the conductivity, or inverse on the ON resistance, of a transistor.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A charge-canceling bus switch comprising:
   a first input;
   a second input;
   a control input for indicating when the bus switch connects the first input to the second input, and for indicating when the bus switch isolates the first input from the second input;
   a p-channel main transistor having a conducting channel selectively coupling the first input to the second input in response to the control input, the p-channel main transistor injecting a first charge into the first input in response to a transition of the control input;
   an n-channel main transistor having a conducting channel selectively coupling the first input to the second input in response to the control input, the n-channel main transistor injecting a second charge into the first input in response to a transition of the control input;
   a first compensating capacitor, coupled to the first input, for injecting a compensating charge into the first input in response to a transition of the control input;
   second compensating capacitor, coupled to the second input, for injecting a second compensating charge into the second input in response to a transition of the control input;
   a connecting transistor, coupled between the first input and the second input, for connecting the first input to the second input before the p-channel main transistor connects the first input to the second input during the transition when the transition of the control input connects the first input to the second input; and
   cross-coupled delay means, coupled to the control input, for generating a first signal to a gate of the p-channel main transistor and a second signal to a gate of the n-channel main transistor;
   wherein a delay from the control input to the first signal is substantially equal to a delay from the control input to the second signal for a transition of the control input,
   whereby the compensating charge compensates for a difference between the first charge and the second charge to reduce a net charge injected into the first input when the transition of the control input occurs.

2. The charge-canceling bus switch of claim 1 wherein the first charge has an opposite polarity to the second charge, and wherein a magnitude of the first charge does not match a magnitude of the second charge.

3. The charge-canceling bus switch of claim 1 wherein:
   the first compensating capacitor comprises a complementary metal-oxide-semiconductor (CMOS) transistor having a source and a drain connected to the first input; and
   wherein the second compensating capacitor comprises a CMOS transistor having a source and a drain connected to the second input.

4. The charge-canceling bus switch of claim 3 wherein:
   the first compensating capacitor has a first gate driven in response to the transition of the control input;
   wherein the second compensating capacitor has a second gate driven in response to the transition of the control input.

5. The charge-canceling bus switch of claim 4 wherein the first gate of the first compensating capacitor is connected to the second gate of the second compensating capacitor.

6. The charge-canceling bus switch of claim 4 wherein the first compensating capacitor is a p-channel transistor and wherein the second compensating capacitor is a p-channel transistor.

7. The charge-canceling bus switch of claim 4 wherein the connecting transistor is a p-channel transistor having a source connected to the first input and a drain connected to the second input.

8. The charge-canceling bus switch of claim 7 wherein the p-channel main transistor is at least ten times larger than the connecting transistor.

9. The charge-canceling bus switch of claim 7 wherein the p-channel main transistor is at least ten times larger than the first compensating capacitor.

10. The charge-canceling bus switch of claim 7 wherein the p-channel main transistor has substantially a same conductivity as the n-channel main transistor, whereby the charge-canceling bus switch is balanced between the p-channel and n-channel main transistors.

11. The charge-canceling bus switch of claim 4 further comprising:
    buffer means, coupled to the control input and separate from the cross-coupled delay means, for driving a control gate of the connecting transistor with a third signal and for driving the gates of the first and second compensating capacitors with a fourth signal;
    wherein the fourth signal is a logical inverse of the third signal,
    whereby the compensating capacitors and the connecting transistor are independently buffered from the p-channel and n-channel main transistors.

12. A bus switch comprising:
    a first input;
    a second input;
    a control input for indicating when the bus switch connects the first input to the second input, and for indicating when the bus switch isolates the first input from the second input;
    a p-channel main transistor having a source connected to the first input and a drain connected to the second input, for selectively coupling the first input to the second input in response to the control input, the p-channel main transistor injecting a first charge into the first input in response to a transition of the control input;
    an n-channel main transistor having a drain connected to the first input and a source connected to the second input, for selectively coupling the first input to the second input in response to the control input, the n-channel main transistor injecting a second charge into the first input in response to a transition of the control input;
    a first compensating capacitor, coupled to the first input, for injecting a compensating charge into the first input in response to a transition of the control input;
    a matched cross-coupled delay, responsive to the control input, for driving a gate of the p-channel main transistor low and for driving a gate of the n-channel main transistor high when the control input transitions to indicate that the bus switch connect the first input to the second input; and
    a buffered delay, responsive to the control input, for driving a gate of the first compensating capacitor high when the control input transitions to indicate that the bus switch connect the first input to the second input, the compensating charge having an opposite polarity to a polarity of the first charge injected by the p-channel main transistor,
    whereby the compensating charge compensates for a difference between the first charge and the second charge to reduce a net charge injected into the first input when the transition of the control input occurs.

13. The bus switch of claim 12 wherein:

the first compensating capacitor comprises a p-channel transistor with a source and a drain connected together and to the first input, the first compensating capacitor having a channel capacitance when the gate of the first compensating capacitor is at least a threshold voltage below a voltage of the first input, but the first compensating capacitor having a parasitic capacitance when the gate is not at least the threshold voltage below the voltage of the first input, and wherein the channel capacitance is greater than the parasitic capacitance.

14. The bus switch of claim 13 further comprising:

a second compensating capacitor comprising a p-channel transistor with a source and a drain connected to the second input and a gate connected to the gate of the first compensating capacitor, whereby both the first input and the second input are compensated.

15. The bus switch of claim 14 further comprising:

a connecting p-channel transistor, having a source connected to the first input and a drain connected to the second input, for selectively coupling the first input to the second input in response to the control input, the connecting p-channel transistor injecting less charge than the first charge;

wherein the buffered delay is further for driving a gate of the connecting p-channel transistor;

wherein a delay through the matched cross-coupled delay to the p-channel main transistor is greater than a delay through the buffered delay to the connecting p-channel transistor, whereby the connecting p-channel transistor connects the first input to the second input before the p-channel main transistor connects the first input to the second input.

16. A low-noise bus switch comprising:

a first input;

a second input;

control means for indicating when the bus switch connects the first input to the second input, and for indicating when the bus switch isolates the first input from the second input;

p-channel main transistor means, having a first gate for controlling connection of a source connected to the first input to a drain connected to the second input;

n-channel main transistor means, having a second gate for controlling connection of a drain connected to the first input to a source connected to the second input;

a first compensating capacitor means being a p-channel transistor with a source and a drain connected to the first input, the first compensating capacitor means having a gate connected to a compensating signal;

a second compensating capacitor means being a p-channel transistor with a source and a drain connected to the second input, the second compensating capacitor means having a gate connected to the compensating signal;

a connecting p-channel transistor means having a third gate for controlling connection of a source connected to the first input to a drain connected to the second input, the connecting p-channel transistor having a conductivity of less than one-tenth of a conductivity of the p-channel main transistor means;

cross-coupled delay means, responsive to the control means, for driving the first gate and the second gate; and buffer delay means, responsive to the control means, for driving the third gate of the connecting p-channel transistor and for driving the compensating signal, the compensating signal being a logical inverse of a signal applied to the third gate, whereby noise is reduced by canceling injected charge from the p-channel main transistor means by the compensating capacitor means.

17. The low-noise bus switch of claim 16 wherein the cross-coupled delay means comprises:

a first NAND gate for driving the first gate, a second NAND gate for driving the second gate, the second NAND gate having an input connected to an output of the first NAND gate, and the first NAND gate having an input connected to an output of a second NAND gate;

the first NAND gate having an input coupled to the control means; and the second NAND gate having an input coupled to a logical inverse of the control means.

* * * * *